United States Patent
Tsunoi et al.

(10) Patent No.: US 6,482,676 B2
(45) Date of Patent: *Nov. 19, 2002

(54) METHOD OF MOUNTING SEMICONDUCTOR CHIP PART ON SUBSTRATE

(75) Inventors: Kazuhisa Tsunoi, Kawasaki (JP); Akira Fujii, Kawasaki (JP); Shunji Baba, Kawasaki (JP); Yoshikazu Hirano, Kawasaki (JP)

(73) Assignee: Fujitsu Limited, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/886,557

(22) Filed: Jul. 1, 1997

(65) Prior Publication Data

US 2002/0048847 A1 Apr. 25, 2002

(30) Foreign Application Priority Data

Jan. 9, 1997 (JP) .............................. 9-002103

(51) Int. Cl.⁷ ............................. H01L 21/48
(52) U.S. Cl. ................. 438/108; 438/613; 228/180.22
(58) Field of Search ................. 438/108, 613, 438/615, 617, 106, 110, 612; 257/737, 738, 780, 772, 773, 778, 786, 734, 779; 228/253, 180.22, 41, 254; 29/413, 414

(56) References Cited

U.S. PATENT DOCUMENTS

| | | | | |
|---|---|---|---|---|
| 3,373,481 A | * | 3/1968 | Lins et al. | 29/413 |
| 4,912,545 A | * | 3/1990 | Go | 257/738 |
| 5,056,216 A | * | 10/1991 | Madou et al. | 29/414 |
| 5,088,639 A | * | 2/1992 | Gondotra et al. | 228/180.1 |

(List continued on next page.)

FOREIGN PATENT DOCUMENTS

| | | | | |
|---|---|---|---|---|
| JP | 57-143838 | * | 9/1982 | 21/60 |
| JP | 62-169433 | | 7/1987 | |
| JP | 1-226162 | | 9/1989 | |
| JP | 2-226610 | | 9/1990 | |
| JP | 2-270327 | | 11/1990 | |
| JP | 3-273637 | | 12/1991 | |
| JP | 4-91444 | | 3/1992 | |
| JP | 4-91445 | | 3/1992 | |
| JP | 4-127548 | | 4/1992 | |
| JP | 4-266038 | | 9/1992 | |
| JP | 4-359442 | | 12/1992 | |
| JP | 5-36697 | | 2/1993 | |
| JP | 5-47770 | | 2/1993 | |
| JP | 5-67648 | | 3/1993 | |
| JP | 5-136201 | | 6/1993 | |
| JP | 5-315337 | | 11/1993 | |
| JP | 6-188289 | | 7/1994 | |
| JP | 7-99202 | | 4/1995 | |
| JP | 7-193101 | * | 7/1995 | |
| JP | 7-297227 | | 11/1995 | |

Primary Examiner—Kamand Cuneo
Assistant Examiner—Alonzo Chambliss
(74) Attorney, Agent, or Firm—Armstrong, Westerman & Hattori, LLP

(57) ABSTRACT

A method of mounting a semiconductor chip part on a substrate, which is capable of realizing high efficiency and high reliability of the mounting works. A leading end of a conductive wire is contact-bonded onto each pad of a semiconductor chip part, followed by tearing of the wire, to form a two-step bump having an upper step portion and a lower step portion larger in volume than the upper step portion. Only the upper step portions of the bumps are then brought in press-contact with a single flattening tool member having a flat surface in such a manner that heights of all of the bumps are made nearly equal to each other. A conductive paste is stuck on the bumps, and the substrate is coated with an adhesive. Thus, the semiconductor chip part is heated and pressurized onto the substrate by a mounting tool in such a state in which the pads are aligned with the corresponding lands of the substrate, to plastically deform the whole of the upper step portions and the lower step portions of the bumps.

19 Claims, 3 Drawing Sheets

U.S. PATENT DOCUMENTS

| | | | | |
|---|---|---|---|---|
| 5,118,027 A | * | 6/1992 | Braun et al. | 228/180.22 |
| 5,195,237 A | * | 3/1993 | Cray et al. | 29/413 |
| 5,306,664 A | * | 4/1994 | Sakura | 438/614 |
| 5,403,776 A | * | 4/1995 | Tsuji et al. | 257/738 |
| 5,508,561 A | * | 4/1996 | Tago et al. | 257/778 |
| 5,601,229 A | * | 2/1997 | Nakazato et al. | 438/615 |
| 5,620,927 A | * | 4/1997 | Lee | 438/126 |
| 5,640,051 A | * | 6/1997 | Tomura et al. | 257/778 |
| 5,641,996 A | * | 6/1997 | Omoya et al. | 257/787 |
| 5,795,818 A | * | 8/1998 | Marrs | 438/612 |
| 5,844,316 A | * | 12/1998 | Mallik et al. | 257/738 |
| 5,874,780 A | * | 2/1999 | Murakami | 257/772 |
| 5,889,326 A | * | 3/1999 | Tanaka | 257/778 |
| 5,940,679 A | * | 8/1999 | Tomura et al. | 438/614 |
| 5,941,449 A | * | 8/1999 | Le Coz et al. | 228/253 |
| 6,177,730 B1 | * | 1/2001 | Kira et al. | 257/778 |
| 6,291,269 B1 | * | 9/2001 | Kira et al. | 438/110 |

* cited by examiner

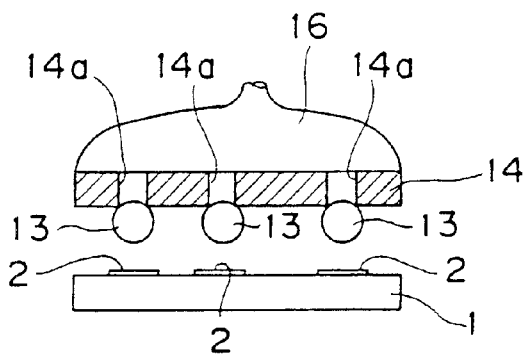
F I G. 3A
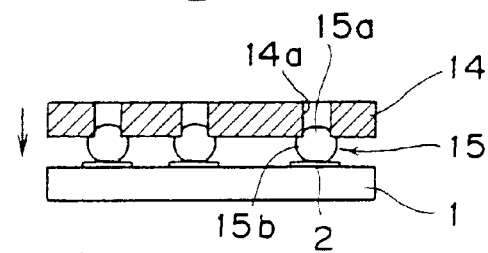
F I G. 3B
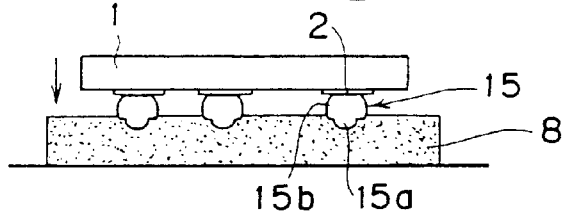
F I G. 3C
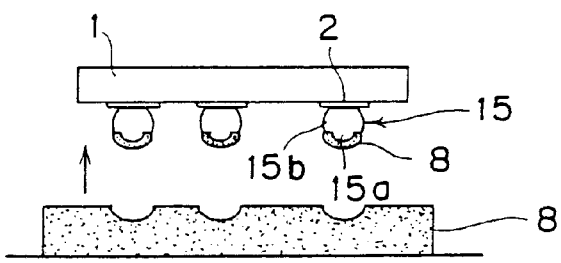
F I G. 3D
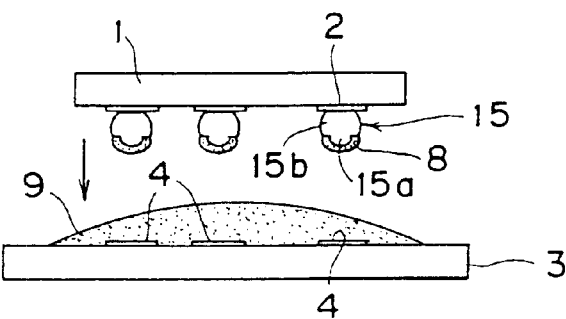
F I G. 3E
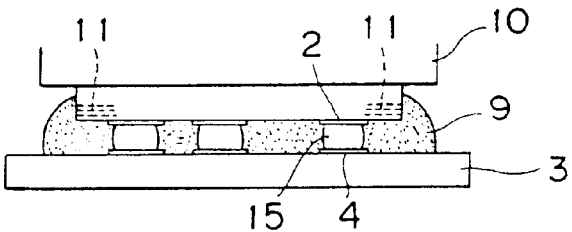
F I G. 3F

METHOD OF MOUNTING SEMICONDUCTOR CHIP PART ON SUBSTRATE

BACKGROUND OF THE INVENTION

1. Field of the Invention

The present invention relates to a method of mounting a semiconductor chip part having a plurality of pads on a substrate having a plurality of lands.

2. Description of the Related Art

A plurality of pads which are conductive electrodes for connection are formed on a semiconductor chip part to be mounted, and lands which are formed in a conductive wiring pattern correspondingly to the pads are formed on a substrate to be formed with the semiconductor chip part.

For example, there have been known two method of mounting a semiconductor chip part on a substrate. One methods involves contact-bonding a gold wire on each of pads formed on a semiconductor chip part by a bonding tool, followed by tearing of the gold wire, to form on each pads a two-step bump having an upper step portion in the vicinity of a portion from which the gold wire is torn and having a relatively small volume and a lower step portion expanded by contact-bonding and having a relatively large volume.

In the above method, the bumps formed on the pads are individually brought in press-contact with part of the bonding tool or a specialized tool having a flat surface in sequence, so that the whole of the upper step portions and the lower step portions of the bumps are plastically deformed, to be thus flattened. The semiconductor chip part thus formed with the bumps is adhesively bonded on the substrate using an adhesive of a thermosetting type or a ultraviolet-ray hardening type in a state in which the pads are aligned with lands formed on the substrate correspondingly to the pads.

Another method of mounting a semiconductor chip part on a substrate involves placing metal balls in reverse taper holes of a mold, mounting a substrate having lands on the mold from top, and pressurizing the substrate onto the mold, to contact-bond the metal balls on the lands by plastically deforming the whole of the metal balls by the mold, thereby forming taper bumps on the lands. The semiconductor chip part having the pads is adhesively bonded on the substrate formed with the bumps by an adhesive of a thermosetting type or a ultraviolet-ray hardening type in a state in which the pads are aligned with the corresponding lands.

According to the former prior art method, since portions of the bumps are individually flattened in sequence, there occurs a problem that it takes a lot of time for the flattening work and also it is difficult to make heights of the bumps equal to each other; and since not only the upper step portions but also the lower step portions of the bumps are plastically deformed at the step of flattening the bumps, there occurs another problem that the bumps allow only slight margins for deformation when the semiconductor chip part is pressurized on the substrate, to thereby reduce a reliability in connection between the pads and lands through the bumps additionally in consideration of the uneven heights of the bumps.

According to the latter prior art method, since the metal balls are placed in the taper holes of the mold, there occurs a problem that the metal balls may be possibly lost by vibration of the mold, etc. and there is a limitation of the posture upon pressing work; and since the whole of the metal balls are plastically deformed at the step of forming the taper bumps, there occurs a problem that the bumps allow only slight margins for deformation at the subsequent step of pressurizing the semiconductor chip part on the substrate, to thereby reduce a reliability in connection between the pads and lands through the bumps.

SUMMARY OF THE INVENTION

An object of the present invention is to provide a method of mounting a semiconductor chip part on a substrate, which is capable of realizing high efficiency and high reliability of the mounting works.

In accordance with an aspect of the present invention, there is provided a method of mounting a semiconductor chip part on a substrate, including the steps of: flattening conductive bumps formed on a plurality of pads of the semiconductor chip part by bringing the conductive bumps in press-contact with a flattening tool member; and pressurizing the semiconductor chip part on the substrate in a state in which the pads are aligned with lands of the substrate corresponding to the pads; wherein a pressurizing force applied at the pressurizing step is larger than a press-contact force applied at the flattening step.

In the mounting method having the above configuration, since a pressurizing force at the pressurizing step is set to be larger than the press-contact force at the flattening step, only part of the bumps are plastically deformed at the work of flattening the bumps and the whole of the bumps are plastically deformed when the semiconductor chip part is pressurized on the substrate, to make larger margins of the bumps for deformation when the semiconductor chip part is pressurized on the substrate. This makes it possible to closely join the bumps to the corresponding lands and hence to increase a reliability in connection between the pads and the lands through the bumps.

In accordance with another aspect of the present invention, there is provided a method of mounting a semiconductor chip part on a substrate, including the steps of: attracting conductive ball members in through-holes of a mask member, each of the through-holes having a diameter smaller than that of each of the ball members; and forming bumps by aligning the ball members with pads of the semiconductor chip part and pressurizing the ball members onto the pads; wherein a pressurizing force applied at the bump forming step is set at a value capable of forming a flat portion on each of the ball members by a ball member attracting surface of the mask member.

In the mounting method having the above configuration, since the ball members are attracted into the through-holes of the mask member and the mask member in such a state is pressurized on the semiconductor chip part, it becomes possible to reduce frequencies of accidents that the ball members are lost and to alleviate the limitation of the posture upon pressing work; and since the pressurizing force is substantially set at a value capable of forming a flat surface on part of each bump at the step of forming the bumps in order to plastically deform only part of the bump, to make larger margins of the bumps for deformation when the semiconductor chip part is pressurized on the substrate. This makes it possible to closely join the bumps to the corresponding lands and hence to increase a reliability in connection between the pads and the lands through the bumps.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 3A to 3F are diagrams illustrating sequence steps of mounting a semiconductor chip part on a substrate according to a second embodiment of the present invention.

DESCRIPTION OF THE PREFERRED EMBODIMENTS

[Embodiment 1]

FIGS. 1A to 1F show sequence steps of mounting a semiconductor chip part on a substrate according to a first embodiment of the present invention. A plurality of pads 2 which are conductive electrodes for connection are formed on a semiconductor chip part 1 to be mounted, and lands 4 which are formed in a conductive wiring pattern correspondingly to the pads 2 are formed on a substrate 3 to be mounted with the semiconductor chip part 1.

Figure 1A:
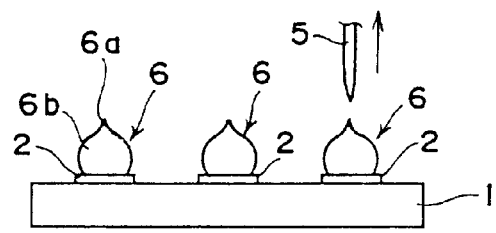
FIGS. 1A to 1F are diagrams illustrating sequence steps of mounting a semiconductor chip part on a substrate according to a first embodiment of the present invention.

First, at a bump forming step shown in FIG. 1A, a gold wire 5 is contact-bonded on each pad 2 of the semiconductor chip part 1 by a bonding tool (not shown), followed by tearing of the gold wire 5, to form on each pad 2 a two-step bump 6 having an upper step 6a in the vicinity of a portion from which the gold wire 5 is torn and having a relatively small volume and a lower step portion 6b expanded by contact-bonding and having a relatively large volume. In addition, the gold wire 5 contains gold in an amount of 95% or more.

Figure 1B:
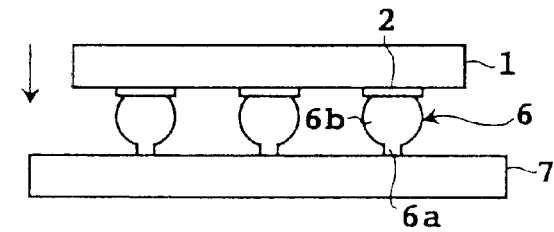

The process goes on to a flattening step shown in FIG. 1B, in which the upper step portions 6a of the bumps 6 are collectively brought in press-contact with a flat plate (flattening tool member) 7 having a flat surface, to plastically deform part of the two-step bumps 6 in such as manner that heights of all of the bumps 6 are made nearly equal to each other. In addition, the above press-contact force is set at a value allowing the lower step portions 6b of the bumps 6 not to be plastically deformed and allowing only the upper step portions 6a of the bumps 6 to be plastically deformed.

Figure 1C:
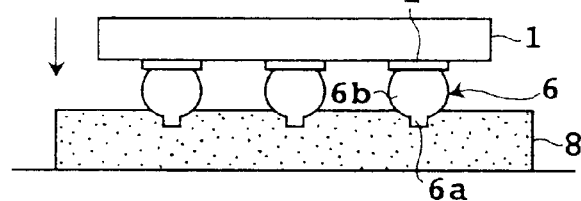
Figure 1D:
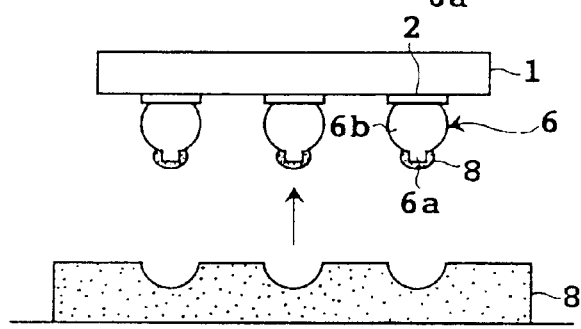

At the next paste sticking step shown in FIGS. 1C and 1D, leading end portions of the bumps 6 are collectively embedded in an almost silver paste (conductive paste) 8 (see FIG. 1C), followed by pulling-up of the leading end portions of the bumps 6 (see FIG. 1D), to stick the almost silver paste 8 on the leading end portions (the upper step portions 6a and part of the lower step portions 6b) of the bumps 6. The reason why the almost silver paste 8 is stuck on the leading end portions of the bumps 6 is to ensure electric connection of the bumps 6 to the lands 4 of the substrate 3. In this embodiment, the almost silver paste 8 is made of a semi-fluidized epoxy resin filled with a filler composed of a plurality of finer silver pieces and another material.

Figure 1E:
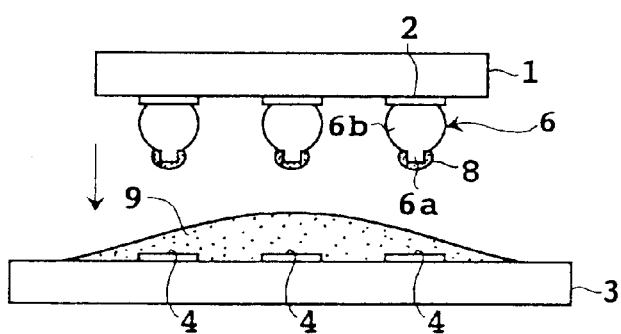

The process goes on to an adhesive coating step shown in FIG. 1E, in which the substrate 3 is coated with an adhesive 9 for adhesively bonding the semiconductor chip part 1 on the substrate 3. As the adhesive 9, there can be used an adhesive mainly composed of an insulating epoxy resin, or an anisotropic adhesive which is insulating in a normal state but which is made partially conductive, when applied with a pressure, only at a portion to which the pressure is applied.

Further, although the adhesive 9 can be of a thermosetting type or a ultraviolet-ray hardening type, the thermosetting type adhesive is used in this embodiment.

In the case of using the insulating adhesive, the coating of the adhesive must be performed with care taken not to stick the adhesive on the lands 4 of the substrate 3 for preventing electric connection between the bumps 6 and lands 4 from being obstructed by the adhesive. In the case of using the anisotropic adhesive, the surface of the substrate 3 on which the lands 4 are formed can be entirely coated with the adhesive without such a limitation.

In the first embodiment, the adhesive 9 is of an insulating type which is made of a semi-fluidized material mainly composed of an epoxy resin incorporated with an acrylic resin. The reason why the acrylic resin is incorporated in the epoxy resin is to facilitate peeling of the semiconductor chip part 1 from the substrate 3 when it is observed that there occurs an inconvenience in mounting of the semiconductor chip part 1 on the substrate 3 after hardening of the adhesive.

The use of such an epoxy resin based adhesive incorporated with an acrylic resin reduces frequencies of breakage of both the substrate 3 and the semiconductor chip part 1 at the peeling step, enabling re-use of both the substrate 3 and the semiconductor chip part 1 after the peeling step. In addition, the substrate 3 is coated with the adhesive 9 in this embodiment; however, the semiconductor chip part 1 may be coated with the adhesive 9.

Figure 1F:
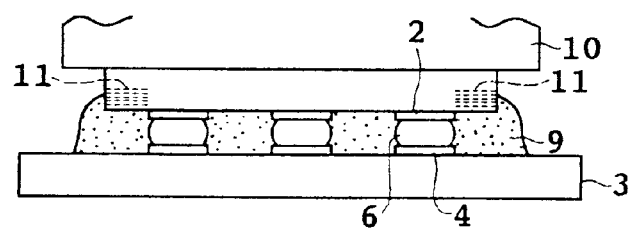

Finally, at a pressurizing step shown in FIGS. 1E and 1F, the semiconductor chip part 1 is positioned over the substrate 3 in a state in which the pads 2 of the semiconductor chip part 1 face to the corresponding lands 4 of the substrate 3 (see FIG. 1E) and the semiconductor chip part 1 is heated at a specific temperature and is applied with a specific pressure (larger than the press-contact force at the flattening step) by a mounting tool (heating/pressing head) 10 (see FIG. 1F), to plastically deform the bumps 6 (the whole of the upper step portions 6a and the lower step portions 6b); and then, heating is stopped with pressurizing continued by the mounting tool 10, and after hardening of the thermosetting adhesive 9, pressurizing is stopped. The works of mounting the semiconductor chip part 1 on the substrate 3 are thus completed.

A coated amount of the adhesive 9 on the substrate 3 is set at a value capable of preventing extrusion or shortage of the adhesive 9 during and after mounting the semiconductor chip part 1 on the substrate 3 in consideration of a distance between the semiconductor chip part 1 and the substrate 3 after mounting, pressure and temperature upon mounting, viscosity of the adhesive, and the like. In general, active layers 11 stacked for fabrication of the semiconductor chip part 1 are exposed on each side end surface of the semiconductor chip part 1 in a state extending up to a position which is about d/3 to d/2 (d: thickness of the semiconductor chip part 1) apart from the pad side. Accordingly, in the first embodiment, the coated amount of the adhesive 9 is set at a value sufficient to cover a region of the semiconductor chip part 1 lower than the position which is about d/3 to d/2 apart from the pad side after mounting the semiconductor chip part 1 on the substrate 3 (see FIG. 1F).

By setting the coated amount of the adhesive 9 at a value sufficient to cover a portion of each side end surface of the semiconductor chip part 1 in consideration of a distance between the semiconductor chip part 1 and the substrate 3 after mounting, pressure and temperature upon mounting, and the like as described above, the active layers 11 exposed on each side end surface of the semiconductor chip part 1 are covered with the adhesive 9, with a result that it is possible to prevent leakage between the active layers 11 and the substrate 3, corrosion due to permeation of moisture in the active layers 11, and the like.

The pressurizing force applied between the semiconductor chip part 1 and the substrate 3 by the mounting tool 10 is set at a value of 5 g to 50 g per each bump in order to reliably join the bumps 6 to the corresponding lands 4. When the pressurizing force is less than 5 g per each bump, it is impossible to obtain a reliable joining therebetween, while when it is more than 50 g for each bump, there is a possibility of occurrence of breakage of the substrate 3 and the semiconductor chip part 1.

In the case of using a multilayered printed wiring board composed of an epoxy resin as the substrate 3, the above pressurizing force applied between the semiconductor chip part 1 and the substrate 3 by the mounting tool 10 must be set in such a manner that a press-in amount of lands (wiring pattern) on the printed wiring board is within a range of 7 μm to 30 μm in consideration of an effect exerted on inner layers (inner wiring layers of the multilayered printed wiring board). In the case of using, for example, a ceramic board as the substrate 3, there is no limitation of the press-in amount of the lands.

The pressurizing force against the substrate 3 and the heating temperature of the semiconductor chip part 1 by the mounting tool 10 are controlled in such a manner that heights of the bumps 6 become 60 μm or less after mounting of the semiconductor chip part 1 and thereby the adhesive force of the adhesive 9 is balanced against the shrinkage force thereof. In the first embodiment, the wiring pattern (lands 4) on the substrate 3 is formed by stacking an aluminum layer, barrier metal layer, nickel layer, and gold layer in this order, and the total thickness of the wiring pattern is set to be 40 μm or less.

Figure 2:
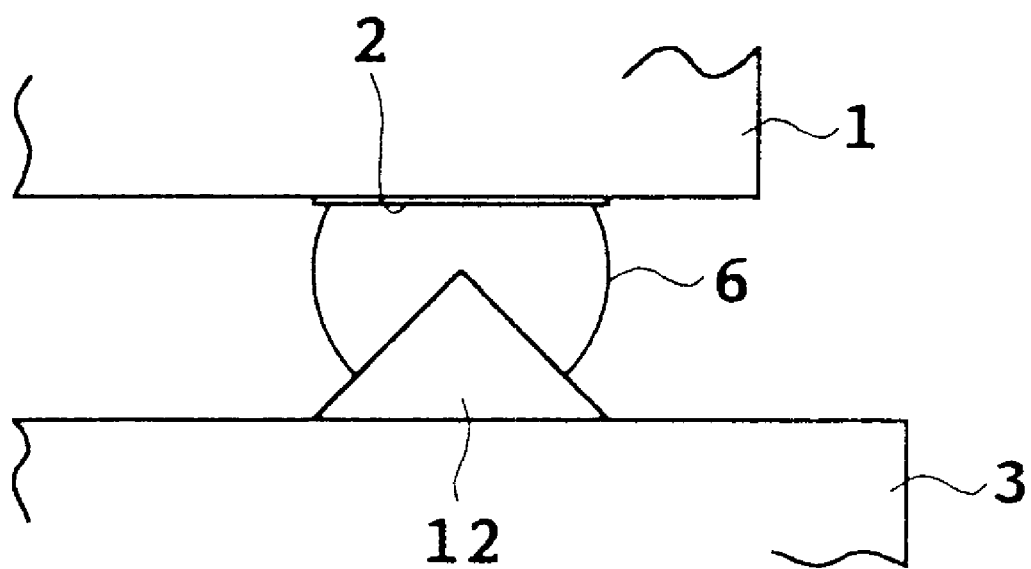
FIG. 2 is a view showing an example in which a shape of each land of the substrate according to the first embodiment of the present invention is changed.

Further, the land 4 formed in a flat shape as shown in FIGS. 1A to 1F may be replaced with a land 12 formed in a triangular shape (taper shape) as shown in FIG. 2. The triangular land 12 bites the bump 6 at the pressurizing step, to thereby improve electric connection therebetween.

The triangular bumps 12 can be formed on the substrate 3 by uniformly forming a copper film on a substrate material, forming or providing a mask having openings only at land forming portions on the copper film, and etching the copper film by injecting an etchant. In this etching, a ratio between a width of each opening of the mask and a thickness of the copper film is set at a value of 1:2 to 1:5. In such an etching condition, the etching using an etchant proceeds with time from an edge to the center of each opening of the mask, and accordingly, the triangular lands 12 can be easily formed by suitably setting an etching time.

According to the first embodiment, there can be obtained the following advantages. Namely, since the bumps 6 are collectively flattened by the single flat plate (flattening tool member) 7, the flattening work can be performed for a short time as compared with the related art method in which the bumps are individually flattened in sequence, and further, the heights of the bumps can be easily made equal to each other.

Since only the upper step portions 6a of the bumps 6 are plastically deformed at the work of flattening the bumps 6 and the whole of the upper step portions 6a and the lower step portions 6b of the bumps 6 are plastically deformed at the step of heating and pressurizing the semiconductor chip part 1 by the mounting tool 10, margins of the bumps 6 for deformation are made larger at the step of heating and pressurizing the semiconductor chip part 1 by the mounting tool 10. This makes it possible to closely join the bumps 6 to the corresponding lands 4 and hence to increase a reliability in connection between the pads and the lands through the bumps.

Since the bumps 6 are plastically deformed by heating and pressurizing the semiconductor chip part 1 by the mounting tool 10, the bumps 6 are joined with the lands 4 of the substrate 3 by metallic bonding, to thereby realize a stable connection therebetween. Further, since the silver paste 8 filled with silver pieces is stuck on the bumps 6 before mounting of the semiconductor chip part 1 on the substrate 3, the silver pieces are interposed between the bumps 6 and the lands 4 or part of the silver pieces bite both or either of the bumps 6 and the lands 4, to thereby improve electric connection between the bumps 6 and the lands 4.

[Embodiment 2]

FIGS. 3A to 3F show sequence steps of mounting a semiconductor chip part on a substrate according to a second embodiment of the present invention, in which parts corresponding to those in the first embodiment are indicated by the same reference numerals. A plurality of pads 2 which are conductive electrodes for connection are formed on a semiconductor chip part 1, and lands 4 which are formed in a conductive wiring pattern correspondingly to the pads 2 are formed on a substrate 3 to be mounted with the semiconductor chip part 1.

First, there are prepared a plurality of gold balls (ball members) 13 each containing gold in an amount of 95% or more, and a mask member 14 having a plurality of ball attracting through-holes 14a each having a diameter smaller than that of each of the gold balls 13. The mask member 14 is formed of a glass glate, stainless steel plate or the like, and the ball attracting holes 14a are formed correspondingly to the plurality of the pads 2 of the semiconductor chip part 1.

At an attracting step shown in FIG. 3A, the mask member 14 is mounted on an attracting tool 16 having an air attracting function, heating function, and a pressurizing function, and one surface side of the mask member 14 is made negative in pressure by actuating the attracting function of the attracting tool 16, to attract the plurality of the gold balls 13 on the other surface side of the mask member 14.

The process goes on to a bump forming step shown in FIG. 3B, in which the gold balls 13 attracted on the mask member 14 by continuously actuating the attracting function of the attracting tool 16 are aligned with the corresponding pads 2, and the mask member 14 is heated and simultaneously the gold balls 13 are pressurized on the semiconductor chip part 1 by actuating the heating and pressing functions of the attracting tool 16, so that the gold balls 13 are thermally contact-bonded on the corresponding pads 2, and at the same time part of each of the gold balls 13 is plastically deformed and inserted in the corresponding ball attracting holes 14a to form a two-step bump 15 composed of an upper step portion 15a having a relatively small volume and a lower step portion 15b having a relatively large volume.

A pressurizing force at the bump forming step is set at such a value as to form only a flat portion on part of the gold ball 13 but not to plastically deform the entire gold ball 13 by a surface of the mask member 14 on which the gold ball 13 is attracted. A ratio between the upper step portion 15a and the lower step portion 15b of the bump 15 can be freely adjusted by controlling the pressurizing force and heating temperature given from the attracting tool 16 or by suitably changing a diameter of each ball attracting hole 14a of the mask member 14.

At the next paste sticking step shown in FIGS. 3C and 3D, leading end portions of the bumps 15 are collectively embedded in an almost silver paste (conductive paste) 8 (see FIG. 3C), followed by pulling-up of the leading end portions of the bumps 15 (see FIG. 3D), to stick the almost silver paste 8 on the leading end portions (the upper step portions 15a and part of the lower step portions 15b) of the bumps 15. The reason why the almost silver paste 8 is stuck on the leading end portions of the bumps 15 is to ensure electric connection of the bumps 15 to the lands 4 of the substrate 3. In this embodiment, the almost silver paste 8 is made of a semi-fluidized epoxy resin filled with a filler composed of a plurality of finer silver pieces and another material.

The process goes on to an adhesive coating step shown in FIG. 3E, in which the substrate 3 is coated with an adhesive 9 for adhesively bonding the semiconductor chip part 1 on the substrate 3. As the adhesive 9, there can be used an adhesive mainly composed of an insulating epoxy resin, or an anisotropic adhesive which is insulating in a normal state but which is made partially conductive, when applied with a pressure, only at a portion to which the pressure is applied. Further, although the adhesive 9 can be of a thermosetting type or a ultraviolet-ray hardening type, the thermosetting type adhesive is used in this embodiment.

In the case of using the insulating adhesive, the coating of the adhesive must be performed with care taken not to stick the adhesive on the lands 4 of the substrate 3 for preventing electric connection between the bumps 15 and lands 4 from being obstructed by the adhesive. In the case of using the anisotropic adhesive, the surface of the substrate 3 on which the lands 4 are formed can be entirely coated with the adhesive without such a limitation.

In the second embodiment, the adhesive 9 is of an insulating type which is made of a semi-fluidized material mainly composed of an epoxy resin incorporated with an acrylic resin. The reason why the acrylic resin is incorporated in the epoxy resin is to facilitate peeling of the semiconductor chip part 1 from the substrate 3 when it is observed that there occurs an inconvenience in mounting of the semiconductor chip part 1 on the substrate 3 after hardening of the adhesive.

The use of such an epoxy resin based adhesive incorporated with an acrylic resin reduces frequencies of breakage of both the substrate 3 and the semiconductor chip part 1 at the peeling step, enabling re-use of both the substrate 3 and the semiconductor chip part 4 after the peeling step. In addition, the substrate 3 is coated with the adhesive 9 in this embodiment; however, the semiconductor chip part 1 may be coated with the adhesive 9.

Finally, at a pressurizing step shown in FIGS. 3E and 3F, the semiconductor chip part 1 is positioned over the substrate 1 in a state in which the pads 2 of the semiconductor chip part 1 face to the corresponding lands 4 of the substrate 3 (see FIG. 3E) and the semiconductor chip part 1 is heated at a specific temperature and is applied with a specific pressure by a mounting tool (heating/pressing head) 10 (see FIG. 3F), to plastically deform the bumps 15 (the whole of the upper step portions 15a and the lower step portions 15b); and then, heating is stopped with pressurizing continued by the mounting tool 10, and after hardening of the thermosetting adhesive 9, pressurizing is stopped. The works of mounting the semiconductor chip part 1 on the substrate 3 are thus completed.

A coated amount of the adhesive 9 on the substrate 3 is set at a value capable of preventing extrusion or shortage of the adhesive 9 during and after mounting the semiconductor chip part 1 on the substrate 3 in consideration of a distance between the semiconductor chip part 1 and the substrate 3 after mounting, pressure and temperature upon mounting, viscosity of the adhesive, and the like. In general, active layers 11 stacked for fabrication of the semiconductor chip part 1 are exposed on each side end surface of the semiconductor chip part 1 in a state extending up to a position which is about d/3 to d/2 (d: thickness of the semiconductor chip part 1) apart from the pad side. Accordingly, in the second embodiment, the coated amount of the adhesive 9 is set at a value sufficient to cover a region of the semiconductor chip part 1 lower than the position which is about d/3 to d/2 apart from the pad 2 side after mounting the semiconductor chip part 1 on the substrate 3 (see FIG. 3F).

By setting the coated amount of the adhesive 9 at a value sufficient to cover a portion of each side end surface of the semiconductor chip part 1 in consideration of a distance between the semiconductor chip part 1 and the substrate 3 after mounting, pressure and temperature upon mounting, and the like as described above, the active layers 11 exposed on each side end surface of the semiconductor chip part 1 are covered with the adhesive 9, with a result that it is possible to prevent leakage between the active layers 11 and the substrate 3, corrosion due to permeation of moisture in the active layers 11, and the like.

The pressurizing force applied between the semiconductor chip part 1 and the substrate 3 by the mounting tool 10 is set at a value of 5 g to 50 g per each bump in order to reliably join the bumps 15 to the corresponding lands 4. When the pressurizing force is less than 5 g per each bump, it is impossible to obtain a reliable joining therebetween, while when it is more than 50 g for each bump, there is a possibility of occurrence of breakage of the substrate 3 and the semiconductor chip part 1.

In the case of using a multilayered printed wiring board composed of epoxy resin as the substrate 3, the above pressurizing force applied between the semiconductor chip part 1 and the substrate 3 by the mounting tool 10 must be set in such a manner that a press-in amount of lands (wiring pattern) on the printed wiring board is within a range of 7 $\mu$m to 30 $\mu$m in consideration of an effect exerted on inner layers (inner wiring layers of the multilayered printed wiring board). In the case of using, for example, a ceramic board as the substrate 3, there is no limitation of the press-in amount of the lands.

The pressurizing force against the substrate 3 and the heating temperature of the semiconductor chip part 1 by the mounting tool 10 are controlled in such a manner that heights of the bumps 15 become 60 $\mu$m or less after mounting of the semiconductor chip part 1 and thereby the adhesive force of the adhesive 9 is balanced against the shrinkage force thereof. In the second embodiment, the wiring pattern (lands 4) on the substrate 3 is formed by stacking an aluminum layer, barrier metal layer, nickel layer, and gold layer in this order, and the total thickness of the wiring pattern is set to be 40 $\mu$m or less.

According to the second embodiment having the above configuration, there can be obtained the following advantages. Namely, since the gold balls 13 are attracted in the ball attracting holes 14a of the mask member 14 and then the mask member 14 is heated and simultaneously pressed on the semiconductor chip part 1, there can be reduces frequencies of accidents that the metal balls are lost as in the related art method, and further, there can be alleviated a limitation of posture upon the heating/pressing work by the mounting tool 10.

Since the gold balls 13 are plastically deformed not entirely but partially upon the work of forming the bumps 15 and the upper step portions 15a and the lower step portions 15b of the bumps 15 are entirely plastically deformed when the semiconductor chip part 1 is heated and pressurized on the substrate 3, there can be made larger margins of the bumps 15 for deformation when the semiconductor chip part 1 is heated and pressurized on the substrate 3. This makes it possible to closely join the bumps 15 on the corresponding lands 4 and hence to increase a reliability in connection between the pads 2 and the lands 4 through the bumps 15.

Since the bumps 15 are plastically deformed by heating and pressurizing the semiconductor chip part 1 by the mounting tool 10, the bumps 15 are joined with the lands 4 by metallic bonding, to thereby realize a stable connection therebetween. Further, since the silver paste 8 filled with silver pieces is stuck on the bumps 15 before mounting of the semiconductor chip part 1 on the substrate 3, the silver pieces are interposed between the bumps 15 and the lands 4 or part of the silver pieces bite both or either of the bumps 15 and the lands 4, to thereby improve electric connection between the bumps 15 and the lands 4.

The mounting method of the present invention has an effect of increasing efficiency and reliability in mounting work of a semiconductor chip part on a substrate.

As the present invention may be embodied in several forms without departing from the spirit or essential characteristics thereof, the embodiments are therefore illustrative and not restrictive, since the scope of the invention is defined by the appended claims rather than by description preceding them, and all changes that fall within meets and bounds of the claims, or equivalence of such meets and bounds are therefore intended to be embraced by the claims.

What is claimed is:

1. A method of mounting a semiconductor chip part on a substrate, comprising the steps of:
    providing a plurality of conductive bumps on a plurality of pads, the conductive bumps each having an upper step portion and a lower step portion larger in volume than the upper step portion;
    flattening the upper step portion of the conductive bumps formed on the plurality of pads of said semiconductor chip part by press-contacting said conductive bumps with a flattening tool member; and
    pressurizing said semiconductor chip part on said substrate such that said pads are aligned with lands formed on said substrate correspondingly to said pads;
    wherein a pressurizing force used at said pressurizing step is larger than a press-contact force used at said flattening step, thereby plastically deforming said upper step portions and said lower step portions of said bumps.

2. A method of mounting a semiconductor chip part on a substrate according to claim 1, further comprising the steps of:
    providing said conductive bumps by contact-bonding a leading end of a conductive wire onto each of said pads of said semiconductor chip part, and tearing said wire;
    sticking a conductive paste on each of said bumps after said flattening step; and then
    coating either said semiconductor chip part or said substrate with an adhesive for adhesively bonding said semiconductor chip part to said substrate;
    wherein said flattening step is a step of bringing only said upper step portions of said bumps in press-contact with a single flattening tool member having a flat surface, thereby making heights of all of said bumps nearly equal to each other; and
    said pressurizing step is a step of pressurizing said semiconductor chip part onto said substrate while heating said semiconductor chip part in a state in which said pads are aligned with said lands corresponding to said pads.

3. A method of mounting a semiconductor chip part on a substrate according to claim 2, wherein a coated amount of said adhesive is set at such a value that part of said adhesive covers only part of side end surfaces of said semiconductor chip part after said semiconductor chip part is mounted on said substrate.

4. A method of mounting a semiconductor chip part on a substrate according to claim 2, wherein said adhesive is made of a semi-fluidized material mainly composed of an epoxy resin incorporated with an acrylic resin.

5. A method of mounting a semiconductor chip part on a substrate according to claim 2, wherein said adhesive is an anisotropic adhesive which is insulating when applied with no pressure but which is made partially conductive, when applied with a pressure, only at a portion to which the pressure is applied.

6. A method of mounting a semiconductor chip part on a substrate according to claim 2, wherein a pressurizing force applied between said semiconductor chip part and said substrate is set at a load of 5 g to 50 g per each bump.

7. A method of mounting a semiconductor chip part on a substrate according to claim 2, wherein said conductive paste is made of a semi-fluidized resin filled with a filler composed of a plurality of conductive metal pieces.

8. A method of mounting a semiconductor chip part on a substrate according to claim 2, wherein a heating temperature and an applied pressure for heating and pressurizing said semiconductor chip part upon mounting said semiconductor chip part on said substrate are controlled in such a manner that a height of each of said bumps after mounting said semiconductor chip part on said substrate is 60 $\mu$m or less.

9. A method of mounting a semiconductor chip part on a substrate having lands formed thereon, comprising the steps of:
    holding conductive ball members in through-holes of a ball member attracting surface of a mask member, each of said through-holes having a diameter smaller than that of each of said ball members;
    forming bumps by aligning said ball members with pads of said semiconductor chip part and pressurizing said ball members onto said pads, wherein a pressurizing force used at said bump forming step is for forming a flat portion on each of said ball members by the ball member attracting surface of said mask member, thereby forming an upper step portion and a lower step portion on said ball members; and
    pressurizing said semiconductor chip part onto said substrate while heating said semiconductor chip part in a state in which said pads are aligned with said lands corresponding to said pads, thereby plastically deforming said upper step portions and said lower step portions of said bumps;
    wherein the pressurizing force used at said bump forming step is set for plastically deforming a part of each of said bumps and a pressuring force used at said pressurizing step is set for plastically deforming a remainder of each of said bumps.

10. A method of mounting a semiconductor chip part on a substrate according to claim 9, further comprising the steps of:
    sticking a conductive paste on said bumps;
    coating either said semiconductor chip part or said substrate with an adhesive for adhesively bonding said semiconductor chip part onto said substrate;
    wherein said attracting step is a step of making negative a pressure on one side of said mask member having a plurality of ball attracting through-holes formed correspondingly to said pads of said semiconductor chip part, each of said ball attracting through-holes having a diameter smaller than that of each of said conductive ball members, thereby attracting said ball members on the other side of said mask member; and said bump forming step is a step of pressurizing said mask member onto said semiconductor chip part while heating said mask member in a state in which said ball members attracted to said mask member are aligned with lands corresponding to said ball members, to plastically deform part of said ball members by said mask member, thereby forming said bumps each having the upper step portion and the lower step portion larger in volume than said upper step portion.

11. A method of mounting a semiconductor chip part on a substrate according to claim 10, wherein said adhesive covers only part of side end surfaces of said semiconductor chip part after said semiconductor chip part is mounted on said substrate.

12. A method of mounting a semiconductor chip part on a substrate according to claim 10, wherein said adhesive is made of a semi-fluidized material mainly composed of an epoxy resin incorporated with an acrylic resin.

13. A method of mounting a semiconductor chip part on a substrate according to claim 10, wherein said adhesive is an anisotropic adhesive which is insulating when applied with no pressure but which is made partially conductive, when applied with a pressure, only at a portion to which the pressure is applied.

14. A method of mounting a semiconductor chip part on a substrate according to claim 10, wherein a pressurizing force applied between said semiconductor chip part and said substrate is set at a load of 5 g to 50 g per each bump.

15. A method of mounting a semiconductor chip part on a substrate according to claim 10, wherein said conductive paste is made of a semi-fluidized resin filled with a filler composed of a plurality of conductive metal pieces.

16. A method of mounting a semiconductor chip part on a substrate according to claim 10, wherein a heating temperature and an applied pressure for heating and pressurizing said semiconductor chip part upon mounting said semiconductor chip part on said substrate are controlled in such a manner that a height of each of said bumps after mounting said semiconductor chip part on said substrate is 60 $\mu$m or less.

17. A method of mounting a semiconductor chip part on a substrate, comprising the steps of:

providing conductive bumps on a plurality of pads of said semiconductor chip part, each of said bumps having an upper step portion and lower step portion larger in volume than said upper step portion;

flattening the upper step portion of said conductive bumps formed on said plurality of pads of said semiconductor chip part by press-contacting said conductive bumps; and pressurizing said semiconductor chip part on said substrate such that said pads are aligned with lands formed on said substrate correspondingly to said pads;

wherein a part of the upper step portion of each of said bumps is plastically deformed in said flattening step; and a remainder of each of said bumps is plastically deformed in said pressurizing step by a pressurizing force which is larger than a press-contact force used in said flattening step.

18. A method of mounting a semiconductor chip part on a substrate according to claim 17, further comprising:

sticking a conductive paste on each of said bumps after the flattening step; and then coating either one of said semiconductor chip part and said substrate with an adhesive for bonding said semiconductor chip part to said substrate;

wherein said flattening step includes a step of flattening only said upper step portion; and said pressurizing step is a step of pressurizing said semiconductor chip part onto said substrate while heating said semiconductor chip part in a state in which said pads are aligned with said lands corresponding to said pads, thereby plastically deforming said upper step portions and said lower step portions of said bumps.

19. A method of mounting a semiconductor chip part on a substrate, comprising the steps of:

providing conductive bumps on a plurality of pads of said semiconductor chip part, each of said bumps having an upper portion and lower portion;

flattening said conductive bumps formed on said plurality of pads of said semiconductor chip part by press-contacting said conductive bumps; and pressurizing said semiconductor chip part on said substrate in a state in which said pads are aligned with lands formed on said substrate correspondingly to said pads;

wherein the upper portion of each of said bumps is plastically deformed in said flattening step; and a remainder of each of said bumps is plastically deformed in said pressurizing step by a pressurizing force which is larger than a press-contact force used in said flattening step.

* * * * *